United States Patent [19]
Ferla et al.

[11] Patent Number: 5,130,272
[45] Date of Patent: Jul. 14, 1992

[54] PROCESS FOR DEFINING AND FORMING AN ACTIVE REGION OF VERY LIMITED DIMENSIONS IN A SEMICONDUCTOR LAYER

[75] Inventors: Giuseppe Ferla, Catania; Paolo Lanza, Cassaro; Carmelo Magro, Catania, all of Italy

[73] Assignee: SGS-Thomson Microelectronics S.r.L., Agrate Brianza MI, Italy

[21] Appl. No.: 728,821

[22] Filed: Jul. 9, 1991

Related U.S. Application Data

[63] Continuation of Ser. No. 553,956, Jul. 17, 1990, abandoned.

[30] Foreign Application Priority Data

Jul. 24, 1989 [IT] Italy .......................... 21281 A/89

[51] Int. Cl.⁵ .................................... H01L 21/22
[52] U.S. Cl. ........................... 437/150; 437/27; 437/149; 437/953; 148/DIG. 111
[58] Field of Search ............. 437/27, 28, 29, 147; 437/148, 149, 150, 953, 978; 148/DIG. 38, DIG. 111

[56] References Cited

U.S. PATENT DOCUMENTS

| | | | |
|---|---|---|---|
| 3,793,721 | 2/1974 | Wakefield et al. | 437/150 |
| 4,503,598 | 3/1985 | Vora et al. | 437/150 |
| 4,774,198 | 9/1988 | Contiero et al. | 437/150 |
| 4,879,254 | 11/1989 | Tsuzuki et al. | 148/DIG. 111 |
| 4,960,723 | 10/1990 | Davies | 437/150 |

Primary Examiner—Brian E. Hearn
Assistant Examiner—C. Chaudhari
Attorney, Agent, or Firm—Wenderoth, Lind & Ponack

[57] ABSTRACT

Along the outline of a first doped region, a first mask is formed. The mask is made up of a dielectric opposed to the oxygen diffusion. Another mask is created within this first mask, using a process of selective thermal oxidation. The second mask is used to implant dopant in a second region which will only be defined along the outlines of the first region.

6 Claims, 3 Drawing Sheets

PROCESS FOR DEFINING AND FORMING AN ACTIVE REGION OF VERY LIMITED DIMENSIONS IN A SEMICONDUCTOR LAYER

This application is a continuation of application Ser. No. 07/553,956, filed on Jul. 17, 1990, now abandoned.

FIELD OF THE INVENTION

This invention relates to a process for defining and forming an active region of very limited dimensions in a semiconductor layer.

BACKGROUND OF THE INVENTION the manufacturing process of semiconductor devices requires defining and forming, one inside the other, active regions which differ for the type of dopant ("p" or "n") or for its concentration.

It is often necessary that these regions occupy the smallest possible space, with the purpose of:
 allowing a higher degree of integrations; and
 improving the performance of the device in connection with the reduction of the resistances associated with the electric paths of the current.

Wishing to define a type n doped region within a larger type p doped region, using the photolithographic techniques most commonly used for the definition of the regions, would limit the minimum realizable dimensions at the following values:
 implanting by projection litography: 4 $\mu$m for region p, 2 $\mu$m for region n;
 implanting by "stepper" type photoexposure: 1.7 $\mu$m for region p, 1 $\mu$m for region n.

To define and form these regions without the above mentioned dimensional limits imposed by photolithographic techniques, such it is necessary to adopt self-alignment techniques, as the formation of "spacers", which, however, are only applicable for the definition of two "long" active regions, one inside the other (hereinafter the expressions "long region" and "short region" will be used to indicate regions whose sizes are of different orders of magnitude).

In fact, to define a "short" region inside a "long" region it is absolutely necessary, according to known techniques, to adopt the above mentioned photolithograhic techniques, with the minimum dimensional limits they impose.

OBJECT OF THE INVENTION

The process discussed in the present invention makes it possible to define a "short" region inside a "long" region using a new self-alignment technique which enables one to overcome the above minimum dimensional limits. Using the new technology, herewith called "*Complementary Spacer*" or "*CS*" technology, it is in fact possible to obtain within a "long" region, a "short" one with dimensions even below 1000 Angstrom, i.e., at least 10 times smaller than the minimum values permitted with the known technique (photoexposure of the "stepper" type).

SUMMARY OF THE INVENTION

The process for defining and forming an active region of very limited dimensions within another active region of a semiconductor layer, is according to the present invention, characterized by the following steps:
 defining and forming, in the semiconductor layer, a first doped region by oxidizing the surface of the semiconductor layer, opening a window (F) in the superficial oxide, implanting or predepositing dopant and then diffusing the same,
 defining and forming a first mask (M) by a spacer created along the outline of the above-mentioned window (F), the spacer being made up of a dielectric opposing to the diffusion of oxygen,
 forming a second mask (O) of silicon oxide, covering the inner area of the first mask (M), by a process of selective thermal oxidation and
 forming an active region of very limited dimensions by a process of implantation or predeposition of dopant and subsequent diffusion using the second mask (O).

BRIEF DESCRIPTION OF THE DRAWINGS

A fuller understanding of the invention may be held by referring to the following description and the accompanying drawings, relevant to some embodiments to be regarded of an illustrative rather than a restrictive nature, in which.

DESCRIPTION

FIGS. 1, 2, 3, 4 and 5 illustrate an example of a known process for forming an active "long" region R2 within another "long" region R1 using the "spacer" technology.

According to this technology, after having created a first region R1 in layer 1 by usual operations of superficial oxidation (oxide layer 2), photomasking, implantation or predeposition of the dopant and diffusion of the same (FIG. 1), a layer of silicon oxide SiO$_2$ or of polycrystalline silicon (layer 3 of FIG. 2) is deposited by CVD (Chemical Vapour Deposition) technology, the layer being of a thickness which is in a pre-established relation to the dimensions of the window to be obtained (the greater the thickness of layer 3, the wider the spacer obtained).

Figure 3:
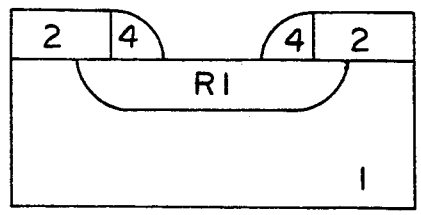

Layer 3 is than etched, using RIE (Reactive Ion Etching) technology, and a spacer 4 is consequently formed along the outline of the window of the previous photomasking (FIG. 3).

Figure 4:
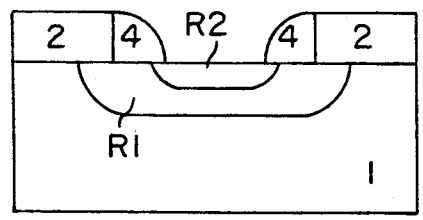

Finally the second region R2 is created by implantation or predeposition of a dopant and subsequent diffusion in the window outlined by the spacer (FIG. 4).

Figure 5:
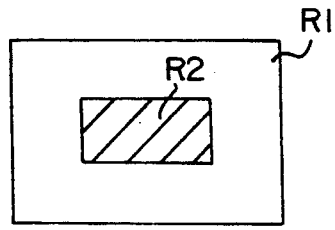

At the end of this process two regions R1 and R2 are obtained whose areas differ substantially by a value equal to the area occupied by the spacer during the process, as illustrated in FIG. 5.

FIGS. 6 to 14 illustrate a first example of a process for defining and forming a "short" region inside a "long" region by CS technology according to the present invention.

Figure 1:
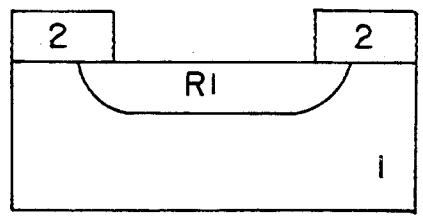
FIGS. 1–5: refer to an example of the known "spacers technology.
Figure 2:
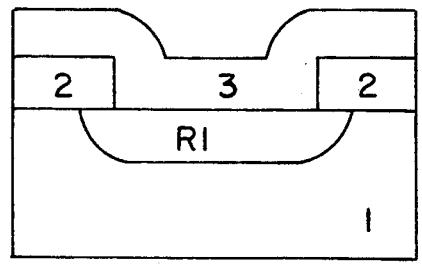
Figure 7:
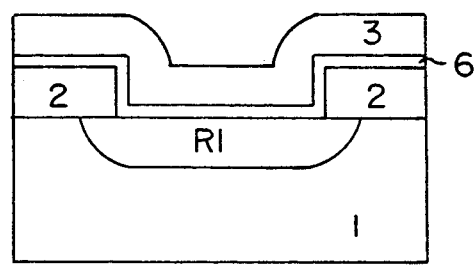
Figure 8:
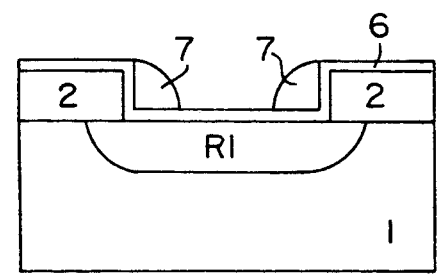
Figure 9:
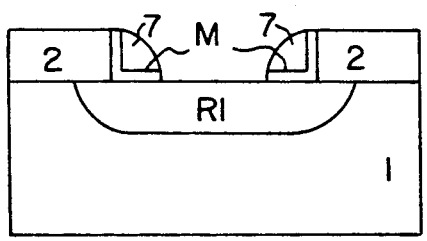
Figure 10:
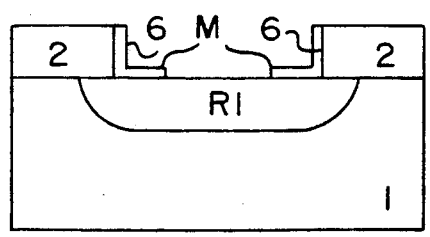
Figure 11:
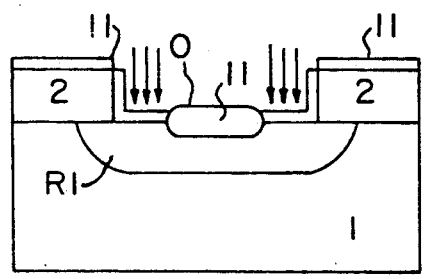
Figure 12:
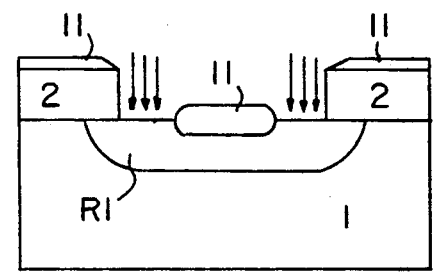
Figure 13:
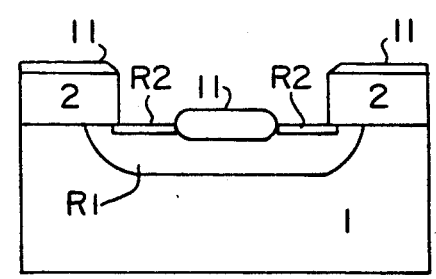

This example foresees the following steps in sequence:

(1) photomasking (with the resulting opening of a window F), implanting and diffusing the "long" region R1 (FIG. 6) using the known technology (see comment to FIG. 1);

(2) depositing a thin layer 6 of silicon nitride ($Si_3N_4$), 200-400 Angstrom thick (FIG. 7);

(3) depositing, by CVD technology, a layer 3 of silicon oxide ($SiO_2$) (vapox oxide) or Poly Silicon (or silicides of refractory metals or a combination of these), the layer having a thicknesses varying from 1500 to 10,000 Angstrom (FIG. 7), according to the required dimensions for the window to be obtained;

(4) etching layer 3 by RIE technology and forming a spacer 7 along the walls of the previous photomasking (FIG. 8);

(5) etching the silicon nitride ($Si_3N_4$) in the areas not protected by $SiO_2$ (FIG. 9);

(6) removing spacer 7 by chemical etching (FIG. 10), with the resulting formation of a mask M of $Si_3H_4$;

(7) forming a layer 11 of silicon oxide ($SiO_2$) (FIG. 11) by a process of selective thermal oxidizing (in fact the oxide will not grow under the nitride), with the resulting formation of a mask O of silicon oxide;

(8) implanting dopant in the "short" region through the nitride (FIG. 11) or after removal of the same (FIG. 12) as the case may be (whether the nitride is removed or not depends on the need to obtain more or less profound implant profiles).

Figure 14:
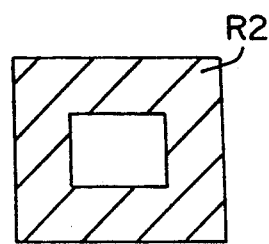

The "short" region thus obtained using the CS technology is illustrated by the cross-sectional view of FIG. 3 and by the plan view of FIG. 14.

Using the above CS technology the following variations may be adopted.

Figure 15:
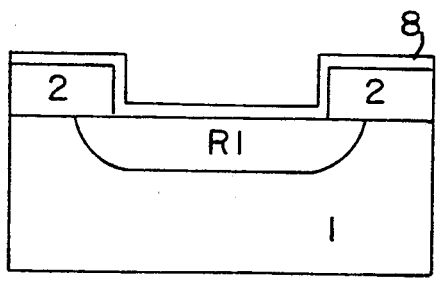
FIG. 15: refers to a second example of CS technology according the present invention.

According to a first variation, between steps 1 and 2 is prepared above, a thin layer 8 of silicon oxide ($SiO_2$) is prepared to act as a "pad" layer (to damp the stresses produced by the successive layers deposited by CVD) which is approximately 100-1000 Angstrom thick, as for example in FIG. 15. In this variation, only the spacer is removed in step 6 and not the pad oxide under the silicon nitride.

Figure 6:
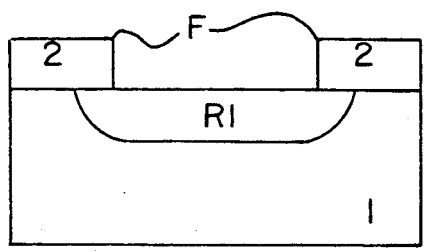
FIGS. 6–14: refer to a first example of CS (Complementary Spacer) technology according to the present invention.
Figure 16:
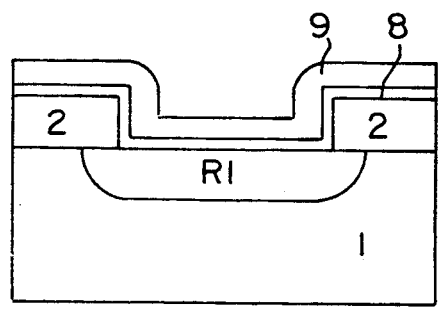
FIGS. 16–19: refer to a third example of a Power MOS obtained with CS technology.
Figure 17:
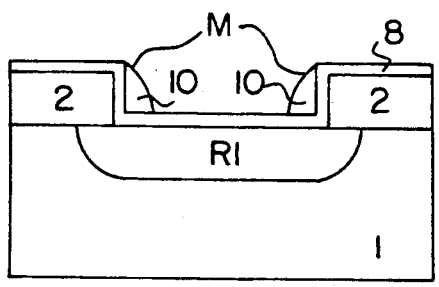
Figure 18:
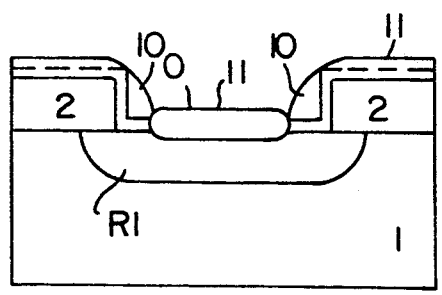
Figure 19:
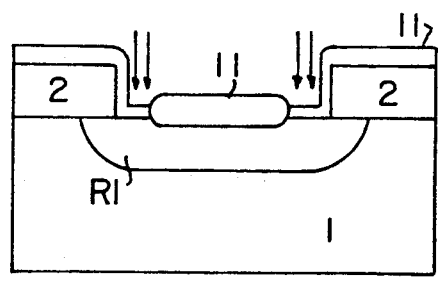

According to a further embodiment the "short" region is created by the following steps:

(a) photomasking, implanting and diffusing the "long" region R1 (FIG. 6);

(b) growing a layer 8 of oxide as a "pad" layer, a few hundred Angstrom thick (FIG. 15);

(c) depositing a layer 9 of silicon nitride ($Si_3N_4$), 1000-3000 Angstrom thick (FIG. 16);

(d) etching the silicon nitride using RIE technology and creating a spacer 10 of nitride next to the wall of the previous photomasking (FIG. 17), with the resulting formation of a mask M of $Si_3H_4$;

(e) forming an oxide layer 11 by a process of selective thermal oxidation (FIG. 18), with the resulting formation of a mask of silicon oxide;

(f) removing spacer 10 and implanting the "short" region as illustrated in FIG. 19. This implantation can be performed through the oxide pad as shown in FIG. 19 or after removal of the same, according to the required depth.

This variation is preferable when it is necessary to define very short regions, because by reducing the number of depositions it is possible to increase the precision in the dimensions.

The following advantages of the CS technology are to be added to the principal advantages previously pointed out:

the possibility of creating active "short" regions of particularly small dimensions at the edges of long regions means that even the "long" regions can be made smaller, and the size of the chip itself can be reduced;

forming the Complementary Spacer by means of CVD deposition makes it possible to limit the uncertainty of the dimensions of the "short" region to a few hundred Angstrom;

the step of photomasking necessary for the definition of the "short" region is eliminated.

Figure 20:
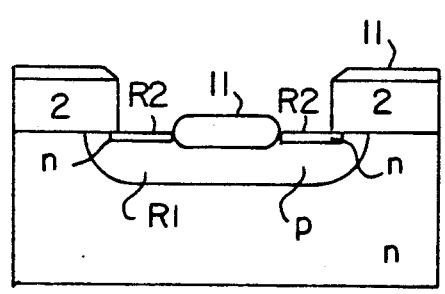
FIG. 20: refers to an example of a Power MOS obtained with CS technology.
Figure 21:
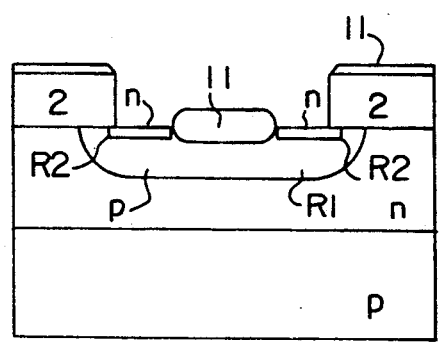
FIG. 21: refers to an example of a HIMOS device obtained with CS technology.

As far as possible applications are concerned, it should be pointed out that the CS technology can be applied be pointed out that the CS technology can be applied in the manufacture of Power MOS (FIG. 20) and HIMOS (FIG. 21) devices. In these applications the "long" region R1 constitutes the body, the "short" regions R2 represent the source, while 2 constitutes the gate.

Figure 22:
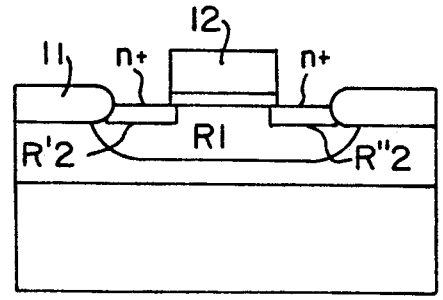
FIG. 22: refers to an example of a lateral MOS transistor obtained with CS technology.

A further application is represented by lateral MOS transistors (FIG. 22) in which the "short" regions R'2 and R"2 represent, respectively, the source and the drain, while layer 12 of polysilicon, obtained by CVD deposition and subsequent photomasking, constitutes the gate.

We claim:

1. A process for defining and forming an active region of very limited dimensions within another active region of a semiconductor layer, said process comprising the steps of:

providing a semiconductor layer;

defining and forming a first doped region in said semiconductor layer by oxidizing the surface of said semiconductor layer, opening a window in the oxidized surface of said semiconductor layer, implanting or predepositing a dopant and diffusing the dopant to form a first active region;

defining and forming a first mask by forming a spacer along the outline of said window, said first mask being made of a dielectric opposing the diffusion of oxygen;

forming a second mask covering an area not covered by said first mask; and removing said spacer along the outline of said window and forming a second active region by implanting or predepositing a dopant and subsequently diffusing said dopant, said second active region being formed in the area not covered by said second mask.

2. The process of claim 1, wherein said step of defining and forming said first mask comprises:

growing a superficial layer of $SiO_2$;

depositing a layer of silicon nitride; and etching said layer of silicon nitride by reactive ion etching to form said spacer along the outline of said window.

3. A process for defining and forming an active region of very limited dimensions within another active region of a semiconductor layer, said process comprising the steps of:

providing a semiconductor layer;

defining and forming a first doped region in said semiconductor layer by oxidizing the surface of said semiconductor layer, opening a window in the oxidized surface of said semiconductor layer, implanting or predepositing a dopant and diffusing the dopant to form a first active region;

forming a spacer along the outline of said window;

removing said layer of dielectric in the areas not covered by said spacer;

forming a first mask of said dielectric opposing the diffusion of oxygen, along the outline of said window, by removing said spacer;

forming a second mask of silicon oxide by selective thermal oxidation, said second mask covering an area not covered by said first mask; and forming a second active region by implanting or predepositing a dopant and subsequently diffusing said dopant, said second active region being formed in the area not covered by said second mask.

4. The process of claim 3, wherein said dielectric opposing the diffusion of oxygen is silicon nitride.

5. The process of claim 3, wherein said step of forming said spacer comprises:

depositing a layer of $SiO_2$, polycrystalline silicon or silicides of refractory metals, or a combination of $SiO_2$, polycrystalline silicon and silicide of refractory metals, by chemical vapor deposition; and etching said subsequent layer by reactive ion etching to form said spacer along the outline of said window.

6. The process of claim 3, wherein a step of growing a superficial layer of $SiO_2$ precedes said step of depositing a layer of silicon nitride.

* * * * *